United States Patent
Basker et al.

(10) Patent No.: US 10,283,406 B2
(45) Date of Patent: May 7, 2019

(54) FABRICATION OF SELF-ALIGNED GATE CONTACTS AND SOURCE/DRAIN CONTACTS DIRECTLY ABOVE GATE ELECTRODES AND SOURCE/DRAINS

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/412,446

(22) Filed: Jan. 23, 2017

(65) Prior Publication Data

US 2018/0211874 A1  Jul. 26, 2018

(51) Int. Cl.
*H01L 21/28* (2006.01)
*H01L 21/768* (2006.01)
(Continued)

(52) U.S. Cl.
CPC .. *H01L 21/76897* (2013.01); *H01L 21/28088* (2013.01); *H01L 21/76805* (2013.01);
(Continued)

(58) Field of Classification Search
CPC ......... H01L 21/28088; H01L 21/76805; H01L 21/76844; H01L 21/76897
See application file for complete search history.

(56) References Cited

U.S. PATENT DOCUMENTS 7,875,913 B2  1/2011  Rhodes
8,507,375 B1  8/2013  Labonte et al.
(Continued)

OTHER PUBLICATIONS

IBM et al., "Trench Silicide Contacts", IP.com Electronic Publication. An IP.com PriorArt Database Technical Disclosure. Jul. 1, 2009. IP.com No. 000184829. pp. 1-2.
(Continued)

*Primary Examiner* — Cuong Q Nguyen
(74) *Attorney, Agent, or Firm* — Tutunjian & Bitetto, P.C.; Vazken Alexanian

(57) ABSTRACT

A method of forming an active device having self-aligned source/drain contacts and gate contacts, including, forming an active area on a substrate, where the active area includes a device channel; forming two or more gate structures on the device channel; forming a plurality of source/drains on the active area adjacent to the two or more gate structures and device channel; forming a protective layer on the surfaces of the two or more gate structures, plurality of source/drains, and active layer; forming an interlayer dielectric layer on the protective layer; removing a portion of the interlayer dielectric and protective layer to form openings, where each opening exposes a portion of one of the plurality of source/drains; forming a source/drain contact liner in at least one of the plurality of openings; and forming a source/drain contact fill on the source/drain contact liner.

13 Claims, 12 Drawing Sheets

(51) Int. Cl.
  *H01L 23/535* (2006.01)
  *H01L 29/49* (2006.01)
  *H01L 29/66* (2006.01)
  *H01L 29/417* (2006.01)
  *H01L 29/78* (2006.01)

(52) U.S. Cl.
  CPC ...... *H01L 21/76843* (2013.01); *H01L 23/535* (2013.01); *H01L 29/41791* (2013.01); *H01L 29/4966* (2013.01); *H01L 29/66795* (2013.01); *H01L 29/785* (2013.01)

(56) References Cited

U.S. PATENT DOCUMENTS

| | | | |
|---|---|---|---|
| 8,564,030 B2 | 10/2013 | Schultz | |
| 8,836,129 B1* | 9/2014 | Hung | H01L 21/76844 257/758 |
| 8,878,311 B2 | 11/2014 | Cheng et al. | |
| 9,130,023 B2 | 9/2015 | Yamasaki | |
| 9,793,372 B1 | 10/2017 | Smith et al. | |
| 2008/0079090 A1 | 4/2008 | Hwang et al. | |
| 2013/0187171 A1 | 7/2013 | Guillorn et al. | |
| 2014/0077305 A1 | 3/2014 | Pethe et al. | |
| 2015/0060960 A1 | 3/2015 | Xie et al. | |
| 2015/0372085 A1 | 12/2015 | Lee et al. | |
| 2015/0380305 A1* | 12/2015 | Basker | H01L 21/76846 257/77 |
| 2016/0111436 A1* | 4/2016 | Ding | H01L 27/11573 257/314 |
| 2017/0077031 A1 | 3/2017 | Lu et al. | |
| 2017/0084721 A1* | 3/2017 | Hung | H01L 21/76897 |
| 2017/0162675 A1* | 6/2017 | Yim | H01L 21/823828 |
| 2018/0190653 A1 | 7/2018 | Lu et al. | |

OTHER PUBLICATIONS

Office Action with cited art in corresponding U.S. Appl. No. 15/685,686 dated Jan. 11, 2019.

* cited by examiner

US 10,283,406 B2

FABRICATION OF SELF-ALIGNED GATE CONTACTS AND SOURCE/DRAIN CONTACTS DIRECTLY ABOVE GATE ELECTRODES AND SOURCE/DRAINS

BACKGROUND

Technical Field

The present invention generally relates to formation of self-aligned gate contacts and source/drain contacts, and more particularly to self-aligned gate contacts and source/drain contacts directly above gate electrodes and source/drains.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

A method is provided for forming an active device having self-aligned source/drain contacts and gate contacts. The method includes the steps of forming an active area on a substrate, where the active area includes a device channel; forming two or more gate structures on the device channel; forming a plurality of source/drains on the active area adjacent to the two or more gate structures and device channel; forming a protective layer on the surfaces of the two or more gate structures, plurality of source/drains, and active layer; forming an interlayer dielectric layer on the protective layer; removing a portion of the interlayer dielectric and protective layer to form a plurality of openings, where each opening exposes at least a portion of one of the plurality of source/drains; forming a source/drain contact liner in at least one of the plurality of openings, wherein the protective layer is between the source/drain contact liner and at least one of the two or more gate structures; and forming a source/drain contact fill on the source/drain contact liner.

A method is provided for forming an active device having self-aligned source/drain contacts and gate contacts. The method includes the steps of forming an active area on a substrate, where the active area includes a device channel; forming two or more gate structures on the device channel, wherein each of the two or more gate structures includes a gate dielectric layer, a conductive gate fill, and a work function layer within a gate sidewall spacer, and the gate dielectric layer, conductive gate fill, and work function layer are covered by a gate structure cap; forming a plurality of source/drains on the active area adjacent to the two or more gate structures and device channel; forming a protective layer on the surfaces of the two or more gate structures, plurality of source/drains, and active layer; forming an interlayer dielectric layer on the protective layer; removing a portion of the interlayer dielectric and protective layer to form a plurality of openings, where each opening exposes at least a portion of one of the plurality of source/drains; forming a source/drain contact liner in at least one of the plurality of openings, wherein the protective layer is between the source/drain contact liner and the gate sidewall spacer on one of the two or more gate structures; forming a source/drain contact fill on the source/drain contact liner.

An active device having self-aligned source/drain contacts and gate contacts is provided. The active device having self-aligned source/drain contacts and gate contacts includes an active area on a substrate, where the active area includes a device channel; two or more gate structures on the device channel, wherein each of the two or more gate structures includes a gate dielectric layer, a conductive gate fill, and a work function layer within a gate sidewall spacer, and a gate structure cap on the gate dielectric layer, conductive gate fill, and work function layer; a plurality of source/drains on the active area adjacent to the two or more gate structures and device channel; a source/drain contact liner on each of the plurality of source/drains; a source/drain contact fill on the source/drain contact liner on each of the plurality of source/drains; a protective layer between the source/drain contact liner and the gate sidewall spacer of one of the two or more gate structures; and an inner spacer on the protective layer and source/drain contact liner.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
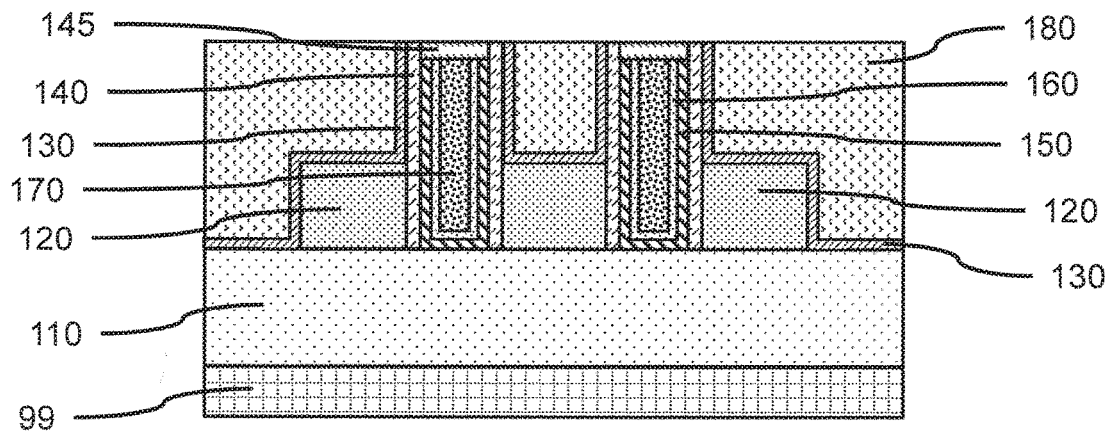
FIG. 1 is a cross-sectional side view showing a pair of gate structures and plurality of source/drains on an active region of a substrate, in accordance with an embodiment of the present invention.

Principles and embodiments of the present invention relate generally to an approach for reducing the area that a device occupies on a region of a substrate by fabricating gate electrical contacts and source/drain electrical contacts directly above the gate structures and source/drains to eliminate the portions of the source/drains and gate structures that extend outward from the active portions of the device components (e.g., channel, source/drains, metal gate, etc.) for out-of-plane electrical connections, vias, etc.

Principles and embodiments of the present invention also relate generally to forming self-aligned source/drain and gate contacts to avoid electrical shorting between conductive device features due to misalignment of masking patterns and openings in insulating materials. In particular, self-aligned spacers (e.g., gate sidewall spacers, inner spacers) can be formed on device sidewalls to electrically separate the source/drain terminals from the gate contacts.

Principles and embodiments of the present invention also relate generally to staggering the location of the source/drain terminals and gate contacts to form a two-dimensional grid, where the conductive elements are diagonally displaced from each other to increase the distance and thickness of intervening dielectric material. The source/drain terminals and gate contacts can be positioned relative to self-aligned spacers formed on previously formed device features (e.g., gate structure sidewalls). By utilizing controlled thicknesses of the intervening spacer layers, a transistor device occupying a reduced area with tightly controlled dimensions can be formed.

Exemplary applications/uses to which the present principles can be applied include, but are not limited to: formation of system-on-chip (SoC) devices, complex integrated circuits implementing thousands, millions, or tens of millions of active devices (e.g., application specific integrated circuits (ASICs), microprocessors (e.g., CPUs), graphics engines, digital signal processors (DSPs), static and dynamic memory (e.g., SRAM and DRAM), etc.

In various embodiments, the materials and layers may be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions may be epitaxial processes, and the deposited material may be crystalline. In various embodiments, formation of a layer may be by one or more deposition processes, where, for example, a conformal layer may be formed by a first process (e.g., ALD, PEALD, etc.) and a fill may be formed by a second process (e.g., CVD, electrodeposition, PVD, etc.).

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

Referring now to the drawings in which like numerals represent the same or similar elements and initially to FIG. 1, a cross-sectional side view of a pair of gate structures and plurality of source/drains on an active region of a substrate is shown, in accordance with the present principles.

In one or more embodiments, a substrate 99 may be a semiconductor or an insulator with an active surface semiconductor layer. The substrate may include crystalline, semi-crystalline, microcrystalline, or amorphous sections. The substrate 99 may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 99 may be a silicon wafer. In various embodiments, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In one or more embodiments, a region of the substrate 99 can be an active region 110, where dopants have been implanted, and/or channels and sources/drains of a field effect transistor (FET) or fin field effect transistor (FinFET) formed. The active region 110 can include planar metal-oxide-semiconductor field effect transistor (MOSFET) components (e.g., device channel) or fin field effect transistor (FinFET) components (e.g., vertical fins), where the vertical fin can form a device channel. In various embodiments, p-doped and/or n-doped sections can be formed to create source/drains in a substrate directly or on a vertical fin, where a combination of p-type transistors and n-type transistors can be formed in the same active region and electrically coupled to form complementary metal-oxide-semiconductor (CMOS) devices.

In one or more embodiments, one or more gate structures can be formed on the active region 110 of a substrate, where the gate structures can be formed on a planar channel at the surface of the substrate or on a vertical fin extending outward from the surface of the substrate, as would be known in the art. A gate structure can include a gate dielectric layer 150, a conductive gate fill 170, and optionally a work function layer 160, where the work function layer 160 and/or conductive gate fill 170 can form a gate electrode. In various embodiments, the gate structure can be formed by a "gate first" or a "gate last" fabrication process, as would be known in the art. The layers of materials forming the gate structure can be formed one on top of another within a gate sidewall spacer 140, or a gate sidewall spacer 140 can be formed on a gate structure formed by masking and etching a gate stack formed by depositing gate dielectric layer 150, conductive gate fill 170, and optional work function layer 160 on the active area 110.

In one or more embodiments, the gate dielectric layer 150 may be an insulating dielectric layer, for example, a silicon oxide (SiO) or a high-K dielectric.

In one or more embodiments, a work function layer may be formed on the gate dielectric layer 150, where the work function layer 160 may be formed on the exposed portion(s) of the gate dielectric layer 150. The work function layer 160 may be formed on the gate dielectric layer 150 to adjust the electrical properties of the gate electrode. In various embodiments, the work function layer may be optional.

In various embodiments, a work function layer 160 can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer may be a TiN/TiC layer stack.

In one or more embodiments, the work function layer 160 can be formed by a conformal deposition, for example, ALD, PEALD, CVD, PECVD, or combinations thereof. The work function layer 160 can be at least partially etched back.

In various embodiments, the work function layer 160 may have a thickness in the range of about 3 nm to about 11 nm, or may have a thickness in the range of about 5 nm to about 8 nm.

In one or more embodiments, the work function layer 160 forming a first gate structure can be a different material from the work function layer forming a second gate structure, where the material(s) of work function layer 160 can be selected based on whether an, n-type device or a p-type device is being fabricated. In various embodiments, the work function layer 160 can be material(s) specific for an n-type device (e.g., TiN, HfN, etc.) for a first gate structure and material(s) specific for a p-type device (e.g., TiC, TaC, etc.) for an adjacent gate structure, such that the two neighboring devices can be electrically coupled to form a CMOS device. The thickness of the work function layer 160 or layer stack can also be varied to separately control the work function for an nFET and a pFET, or an n-type FinFET and a p-type FinFET.

In one or more embodiments, a gate fill layer 170 can be formed on the gate dielectric layer 150 and/or work function layer 160 if present, where the gate fill layer 170 can fill in the remaining space(s) between gate sidewall spacers 140. The gate fill layer 170, gate dielectric layer 150, and optionally the work function layer 160, can form a gate structure on one or more active vertical fin(s), where the gate fill layer 170 and work function layer 160 can form a conductive gate electrode.

In various embodiments, the gate fill layer 170 can be blanket deposited on the exposed surfaces of the work function layer 160 and/or gate dielectric layer 150 on the vertical fin(s). The gate fill layer material above the gate sidewall spacer 140 may be removed by a CMP to provide a flat, uniform surface.

In various embodiments, the gate fill layer 170 may be a conductive metal, where the metal may be tungsten (W), titanium (Ti), molybdenum (Mo), cobalt (Co), or a conductive carbon material (e.g., carbon nanotube, graphene, etc.), or a suitable combinations thereof.

In one or more embodiments, a gate structure cap 145 can be formed on the top surfaces of the gate dielectric layer 150, conductive gate fill 170, and optional work function layer 160 forming the gate structure. The gate structure cap(s) 145 can be formed within a surrounding gate sidewall spacer 140. In various embodiments, the gate dielectric layer 150, conductive gate fill 170, and optional work function layer 160 can be etched back to form an opening within the gate sidewall spacer 140, where the dielectric layer 150, conductive gate fill 170, and optional work function layer 160 can be etched back using a directional non-selective etch (e.g., dry plasma etch).

In one or more embodiments, two or more source/drains 120 can be formed on an active region 110 of a substrate 99, where the source/drains can be raised source/drains formed on an active region 110 on the substrate 99. In various embodiments, dopant can be implanted to form doped regions in the active region 110, where the dopant can be in portions of the active region 110 below the source/drains 120.

In various embodiments, the source/drains can be formed by masking portions of the active region 110 and gate structures, for example, with a photo or e-beam resist material (e.g., poly methyl methacrylate (PMMA)), and patterning the resist material to form openings adjacent to the gate sidewall spacer(s) 140. The openings can be on opposite sides of the gate structure on the active region 110. A directional etch, for example, a reactive ion etch (RIE), can be used to remove a portion of the resist material to form the openings down to the active region 110.

In various embodiments, the source/drains 120 can be epitaxially grown on the active region 110, where the source/drains have a predetermined crystal structure. The source/drain(s) 120 can be epitaxially grown on the exposed surfaces of a vertical fin forming at least a portion of the active region 110, or on the active region of the substrate.

In one or more embodiments, a protective layer 130 can be formed on the source/drain(s) 120, where the protective layer 130 can be conformally deposited on the exposed surfaces of the source/drain(s) 120, active region 110, and gate sidewall spacer 140, for example, by ALD or PEALD. The protective layer 130 can have a thickness in the range of about 4 nm to about 15 nm, in the range of about 4 nm to about 10 nm, although other thicknesses are contemplated.

In one or more embodiments, the protective layer 130 can be an insulating dielectric layer, where the protective layer 130 can be a silicon nitride (SiN), silicon oxynitride (SiON), a low-k dielectric, a high-k dielectric, silicon borocarbonitride (SiBCN), silicon oxycarbide (SiOC), silicon boro oxycarbide (SIBOC), or combinations thereof, although other insulating dielectrics are also contemplated.

The low-k dielectric material may include, but is not limited to, fluoride-doped silicon oxide (e.g., fluoride doped glass), a carbon-doped silicon oxide, a porous silicon oxide, a spin-on silicon based polymeric material (e.g., tetraethyl orthosilicate (TEOS), hydrogensilsesquioxane (HSQ) and methylsilsesquioxane (MSQ)), or combinations thereof.

In various embodiments, the high-K dielectric material may include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material may further include dopants such as lanthanum and/or aluminum. The stoichiometry of the high-K compounds may vary.

In one or more embodiments, an interlayer dielectric layer 180 can be formed on the protective layer 130, source/drain(s) 120, active region 110, and gate structure, where the interlayer dielectric layer 180 can be blanket deposited to cover the protective layer 130, source/drain(s) 120 and active region 110. The deposited interlayer dielectric (ILD) layer 180 can extend above the top surface of the gate structure and gate structure cap(s) 145, and a chemical-mechanical polishing (CMP) can be used to remove excess interlayer dielectric layer material and provide a smooth, flat surface.

In one or more embodiments, the ILD layer 180 can be silicon oxide (SiO), a low-k insulating dielectric material silicon oxynitride (SiON), boron carbon nitride, methyl doped silica or $SiOx(CH_3)y$ or $SiC_xO_yH_z$, organosilicate glass (SiCOH), porous SiCOH, and/or combinations thereof.

In a non-limiting exemplary embodiment, active area 110 can be a vertical fin on a substrate 99 with two gate structures formed across the vertical fin and a plurality of source/drains can be formed on the vertical fin.

In various embodiments, a plurality of vertical fins may be formed on a substrate 99 by a sidewall image transfer (SIT) process, self-aligned double patterning (SADP), or self-aligned quadruple patterning (SAQP) to provide a tight pitch between vertical fins. In various embodiments, a direct contact lithographic process may be employed for looser fin pitches.

In one or more embodiments, a vertical fin can be formed on a substrate 99, where the vertical fin can be formed by a sidewall image transfer (SIT) process, as would be known in the art. In various embodiments vertical fins may be etched into the substrate 99 or an epitaxial layer on the substrate by employing a lithographic patterning process, a SIT process, (e.g., self-aligned quadruple patterning (SAQP) or a self-aligned double patterning (SADP)), or epitaxially grown on the substrate. In one or more embodiments, fins are formed by a SIT process.

In one or more embodiments, a plurality of vertical fins may be formed from an active region 110 of a substrate 99, where the plurality of vertical fins can formed from the crystalline material of the substrate or a crystalline layer formed on the surface of the substrate 99. The plurality of vertical fins may have a fin pattern on the substrate 99. The vertical fins can be the same material as the substrate 99, or a different material than the substrate, for example, the substrate 99 can be single crystal silicon and the vertical fin(s) can be single crystal silicon-germanium epitaxially grown on the substrate. The vertical fins may be stressed.

Figure 2:
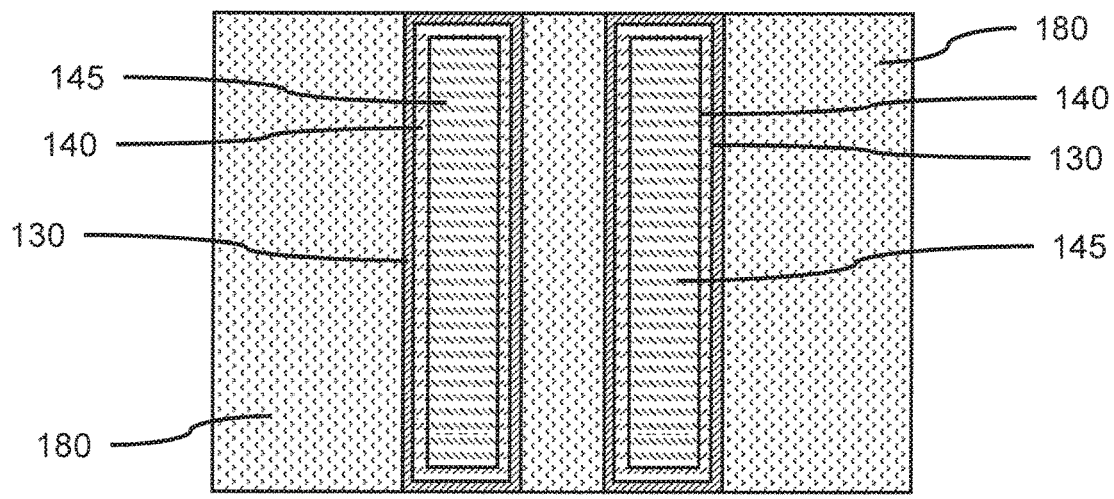
FIG. 2 is a top view showing the pair of gate structures with each covered by a gate structure cap and surrounded by an interlayer dielectric (ILD) layer formed on the active region, in accordance with an embodiment of the present invention.

FIG. 2 is a top view showing the pair of gate structures with each covered by a gate structure cap and surrounded by an interlayer dielectric (ILD) layer formed on the active region, in accordance with an embodiment of the present invention.

In one or more embodiments, portions of the gate structure cap(s) 145, gate sidewall spacer 140, and protective layer 130 may be exposed, whereas the source/drains 120 and portions of the protective layer 120 may be covered by the ILD layer 180.

In one or more embodiments, the gate sidewall spacer 140 and gate structure cap(s) 145 can be an insulating dielectric layer, where the gate sidewall spacer 140 and gate structure cap(s) 145 can be a silicon nitride (SiN), silicon oxynitride (SiON), a low-k dielectric, a high-k dielectric, silicon borocarbonitride (SiBCN), silicon oxycarbide (SiOC), silicon boro oxycarbide (SIBOC), or combinations thereof, although other insulating dielectrics are also contemplated. In various embodiments, the gate structure cap(s) 145 and gate sidewall spacer 140 can be the same material, so the gate structure cap(s) 145 and gate sidewall spacer 140 have the same etch rate for etching processes.

In one or more embodiments, the gate sidewall spacer 140 can have a thickness in the range of about 4 nm to about 15 nm, or in the range of about 4 nm to about 10 nm, although other thicknesses are contemplated.

Figure 3:
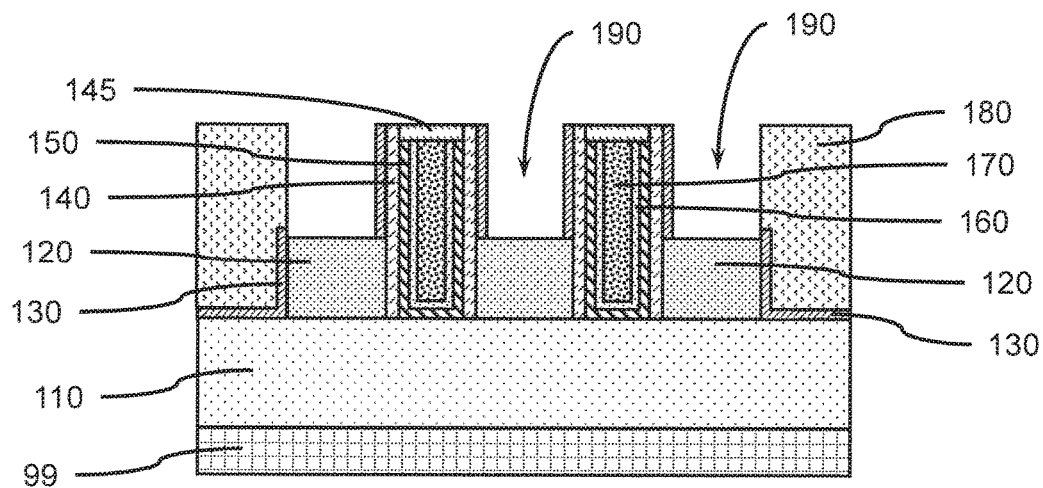
FIG. 3 is a cross-sectional side view showing openings formed in the ILD layer above at least a portion of the source/drains adjacent to the gate structures, in accordance with an embodiment of the present invention.

FIG. 3 is a cross-sectional side view showing openings formed in the ILD layer above at least a portion of the source/drains adjacent to the gate structures, in accordance with an embodiment of the present invention.

In one or more embodiments, a portion of the ILD layer 180 can be removed to form openings 190 that exposes the underlying portions of the protective layer 130 on the source/drains 120. The portion of the ILD layer 180 can be removed by masking portions of the ILD layer and gate structure caps 145 with a resist material, and using a selective directional etch (e.g., RIE) to remove the exposed portion of the ILD layer 180. The gate structure cap(s) 145 and gate sidewall spacer 140 can act as an etch stop to protect the gate structure during the selective removal of the ILD layer 180. The protective layer 130 may remain on the sidewalls of the gate sidewall spacer 140 due to the directionality of the removal process.

In one or more embodiments, the protective layer 130 on the top surface of the source/drains 120 can be removed to expose the source/drains 120 for subsequent formation of an electrical contact. The source/drains 120 can be a doped semiconductor.

Figure 4:
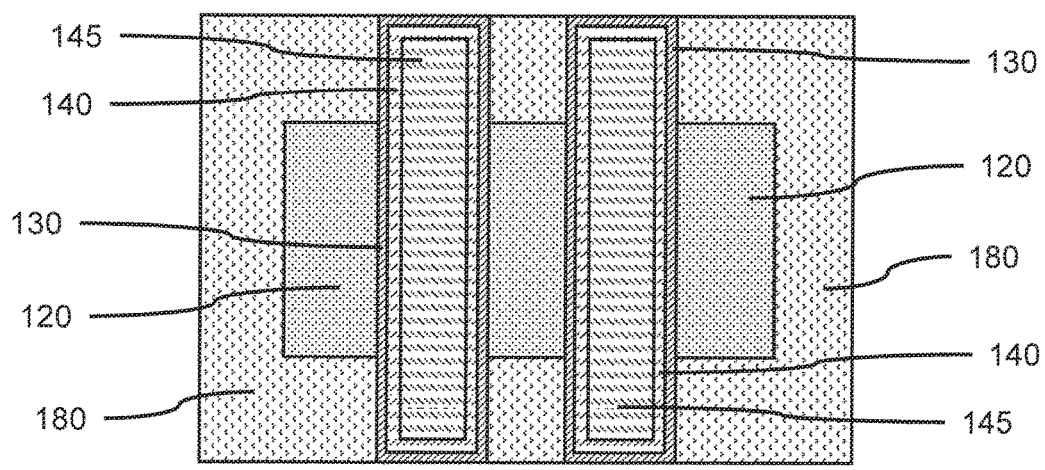
FIG. 4 is a top view showing the top surfaces of the source/drains exposed by the formation of the openings in the ILD layer and removal of a portion of a protective layer from the source/drains, in accordance with an embodiment of the present invention.

FIG. 4 is a top view showing the top surfaces of the source/drains exposed by the formation of the openings in the ILD layer and removal of a portion of a protective layer from the source/drains, in accordance with an embodiment of the present invention.

In one or more embodiments, the removal of the ILD layer 180 and protective layer 130 exposes the top surface of the source/drains 120. The gate structure caps 145 can remain on the gate structure.

Figure 5:
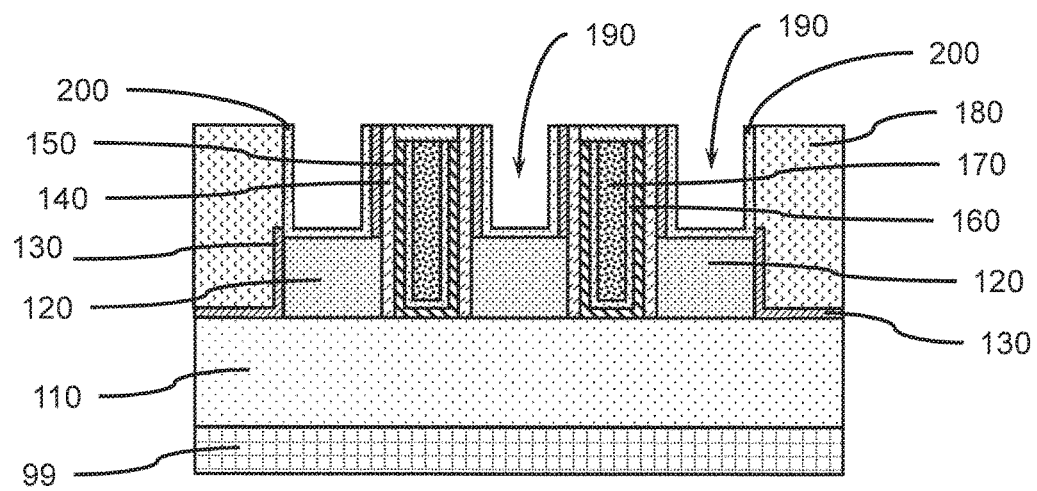
FIG. 5 is a cross-sectional side view showing a source/drain contact liner on the top surfaces of the source/drains and sidewalls of the openings in the ILD layer, in accordance with an embodiment of the present invention.

FIG. 5 is a cross-sectional side view showing a source/drain contact liner on the top surfaces of the source/drains and sidewalls of the openings in the ILD layer, in accordance with an embodiment of the present invention.

In one or more embodiments, a source/drain contact liner 200 can be formed on the top surfaces of the source/drains 120 and sidewalls of the openings in the ILD layer 180, where the source/drain contact liner 200 can be a thin metal liner for contact formation. The source/drain contact liner 200 can modify the electrical connection to the source/drains 120 for a subsequently formed source/drain contact fill.

In one or more embodiments, the source/drain contact liner 200 can be a metal nitride, including but not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), or combinations thereof, where the source/drain contact liner 200 can be a liner and/or seed layer for a source/drain contact fill.

In one or more embodiments, the source/drain contact liner 200 can be formed by a conformal deposition, including but not limited to, ALD, PEALD, and combinations thereof. The source/drain contact liner 200 can have a thickness in the range of about 1 nm to about 4 nm.

Figure 6:
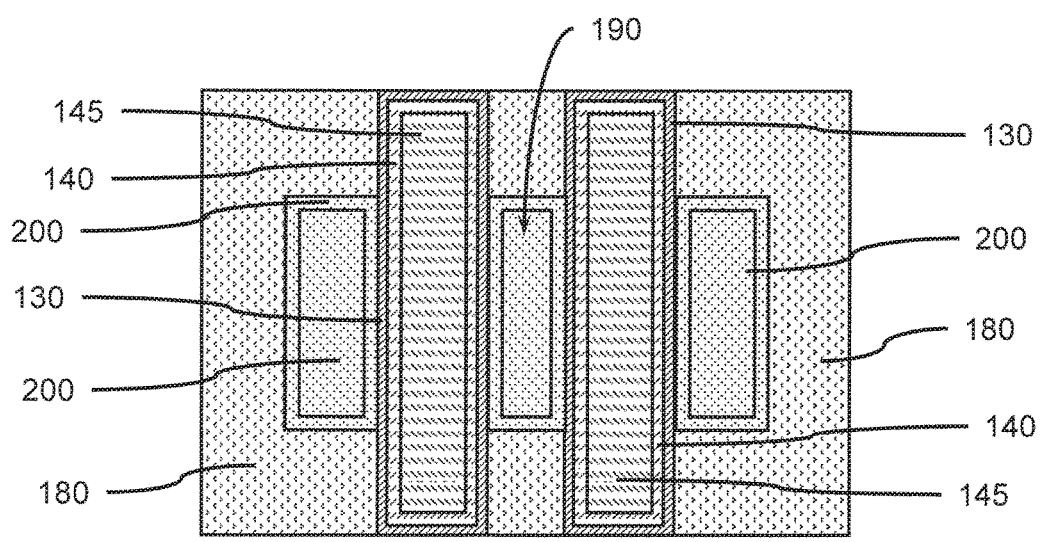
FIG. 6 is a top view showing the source/drain contact liner on the top surfaces of the source/drains and sidewalls of the openings in the ILD layer, in accordance with an embodiment of the present invention.

FIG. 6 is a top view showing the source/drain contact liner on the top surfaces of the source/drains and sidewalls of the openings in the ILD layer, in accordance with an embodiment of the present invention.

In one or more embodiments, the source/drain contact liner 200 can be formed on the top surface of the source/drains 120 and sidewalls of the protective layer 130. Openings 190 can be partially filled by the source/drain contact liner 200, while space remains for formation of the source/drain contact fill on the source/drain contact liner 200.

Figure 7:
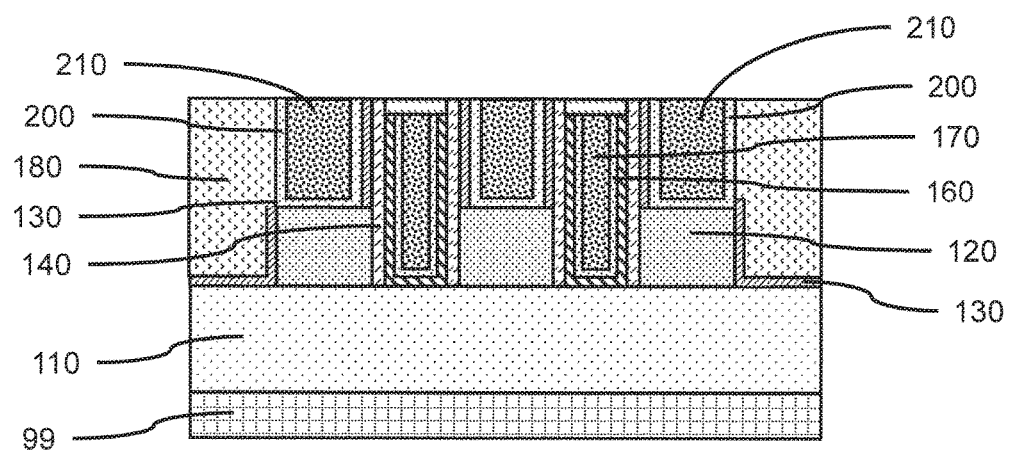
FIG. 7 is a cross-sectional side view showing a source/drain contact fill on the source/drain contact liner in the openings formed in the ILD layer, in accordance with an embodiment of the present invention.

FIG. 7 is a cross-sectional side view showing a source/drain contact fill on the source/drain contact liner in the openings formed in the ILD layer, in accordance with an embodiment of the present invention.

In one or more embodiments, a source/drain contact fill 210 can be formed on the source/drain contact liner 200, where the source/drain contact fill 210 can fill in the opening 190. The source/drain contact fill 210 can be formed by a directional deposition (e.g., gas cluster ion beam (GCIB), PVD, or high density plasma (HDP) to avoid formation of voids within the opening 190. The source/drain contact fill 210 can also be formed by CVD or PECVD. The source/drain contact fill 210 can be blanket deposited, and excess material removed by CMP to provide a smooth, flat surface.

In one or more embodiments, a source/drain contact fill 210 can be a conductive metal, where the metal may be tungsten (W), titanium (Ti), molybdenum (Mo), cobalt (Co), or a conductive carbon material (e.g., carbon nanotube, graphene, etc.), or a suitable combinations thereof.

In one or more embodiments, the source/drain contact liner 200 can be formed to provide an ohmic contact between a semiconductor source/drain 120 and the source/drain contact fill 210.

Figure 8:
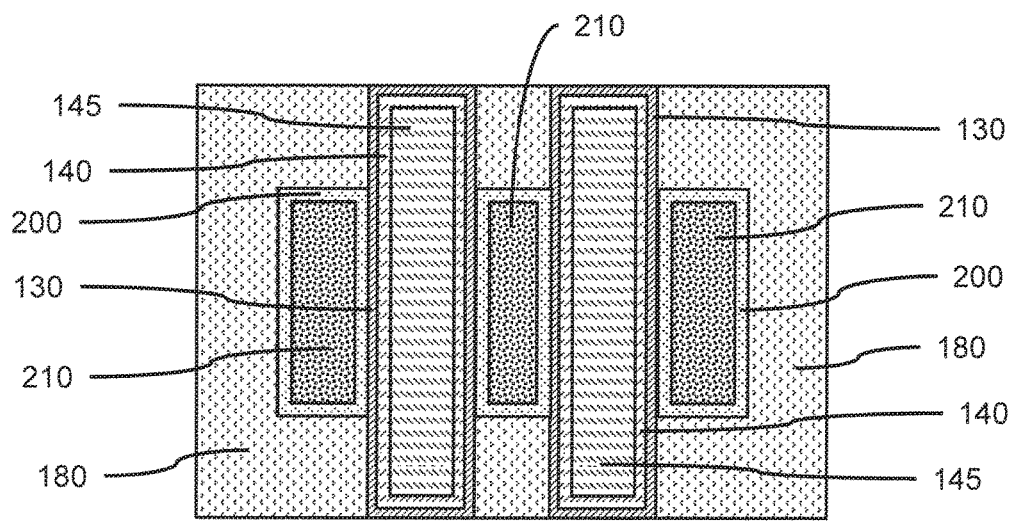
FIG. 8 is a top view showing the source/drain contact fill in the openings formed in the ILD layer adjacent to the gate structures on the active region of the substrate, in accordance with an embodiment of the present invention.

FIG. 8 is a top view showing the source/drain contact fill in the openings formed in the ILD layer adjacent to the gate structures on the active region of the substrate, in accordance with an embodiment of the present invention.

The source/drain contact fill 210 can be in contact with the source/drain contact liner 200 on five sides, where the top surface of the source/drain contact fill 210 remains exposed for subsequent processing.

Figure 9:
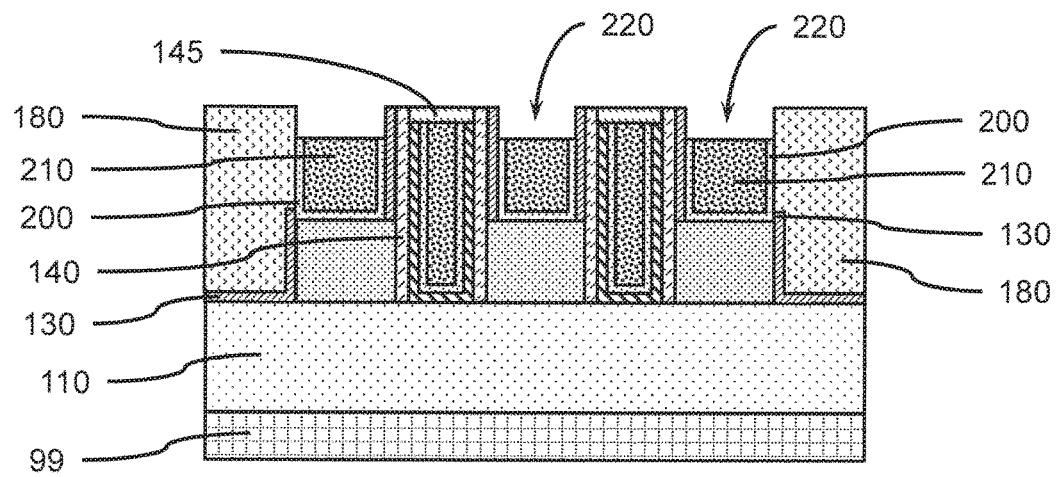
FIG. 9 is a cross-sectional side view showing the source/drain contact fill and source/drain contact liner having a reduced height to form a trough, in accordance with an embodiment of the present invention.

FIG. 9 is a cross-sectional side view showing the source/drain contact fill and source/drain contact liner having a reduced height to form a trough, in accordance with an embodiment of the present invention.

In one or more embodiments, a portion of the source/drain contact fill 210 and source/drain contact liner 200 can be removed to reduce the height of the source/drain contact fill 210 and source/drain contact liner 200 in the opening 190 to form a trough 220. The source/drain contact fill 210 and source/drain contact liner 200 can be removed using a non-selective directional etch (e.g., dry plasma etch) or two separate selective, isotropic etches (e.g., wet etches). Formation of the trough 220 can expose a portion of the protective layer 130 adjacent to the gate structure.

Figure 10:
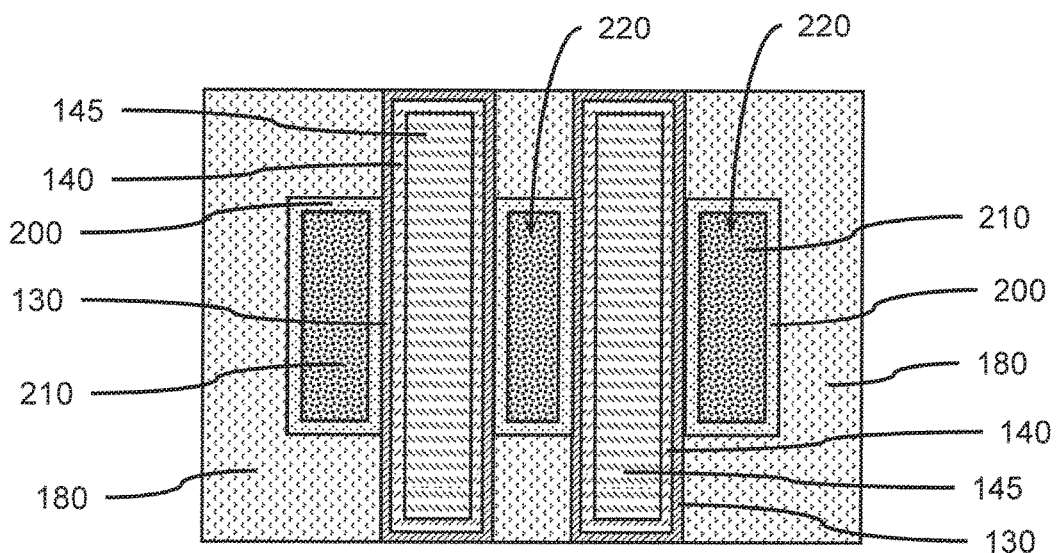
FIG. 10 is a top view showing the exposed surfaces of the source/drain contact fill and source/drain contact liner in the troughs, in accordance with an embodiment of the present invention.

FIG. 10 is a top view showing the exposed surfaces of the source/drain contact fill and source/drain contact liner in the troughs, in accordance with an embodiment of the present invention.

Reducing the height of the source/drain contact fill 210 and source/drain contact liner 200 can provide the trough for formation of a source/drain contact cap, and assist in avoiding electrical shorting of the source/drain contact fill 210 and source/drain contact liner 200 with the gate structure.

Figure 11:
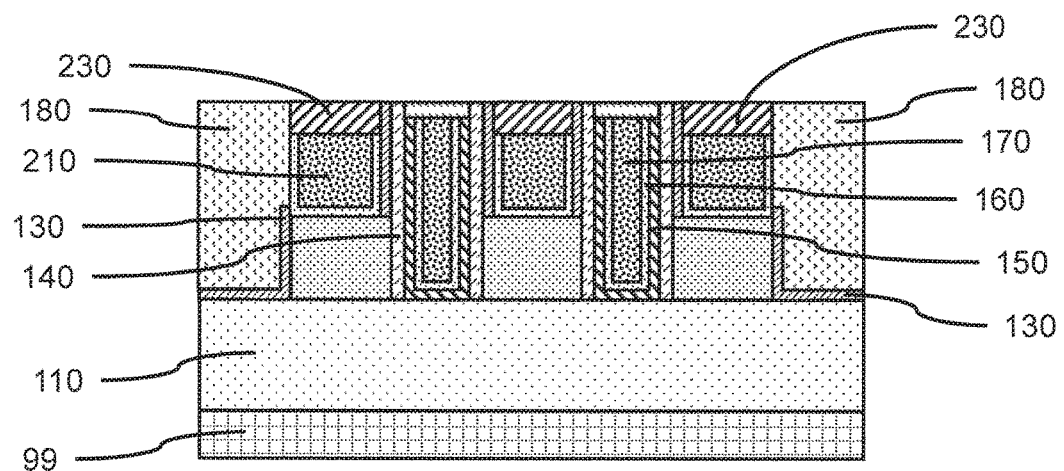
FIG. 11 is a cross-sectional side view showing source/drain contact caps formed in the troughs, in accordance with an embodiment of the present invention.

FIG. 11 is a cross-sectional side view showing source/drain contact caps formed in the troughs, in accordance with an embodiment of the present invention.

In one or more embodiments, a source/drain contact cap 230 can be formed in each trough 220 to cover the source/drain contact fill 210 and source/drain contact liner 200. The source/drain contact cap 230 can be blanket deposited and a CMP used to remove excess material and provide a smooth, flat surface.

In one or more embodiments, the source/drain contact cap 230 can be an insulating dielectric layer, where the source/drain contact cap 230 can be a silicon nitride (SiN), silicon oxynitride (SiON), a low-k dielectric, a high-k dielectric, silicon borocarbonitride (SiBCN), silicon oxycarbide (SiOC), silicon boro oxycarbide (SIBOC), or combinations thereof, although other insulating dielectrics are also contemplated. In various embodiments, the source/drain contact cap 230 is a different material from the gate structure cap(s) 145 and gate sidewall spacer 140, so the source/drain contact cap 230 can be selectively etched in relation to the gate structure cap(s) 145 and gate sidewall spacer 140. The source/drain contact cap 230 can be a different material from the protective layer 130 and the ILD layer 180 to allow for selective removal of the source/drain contact cap.

Figure 12:
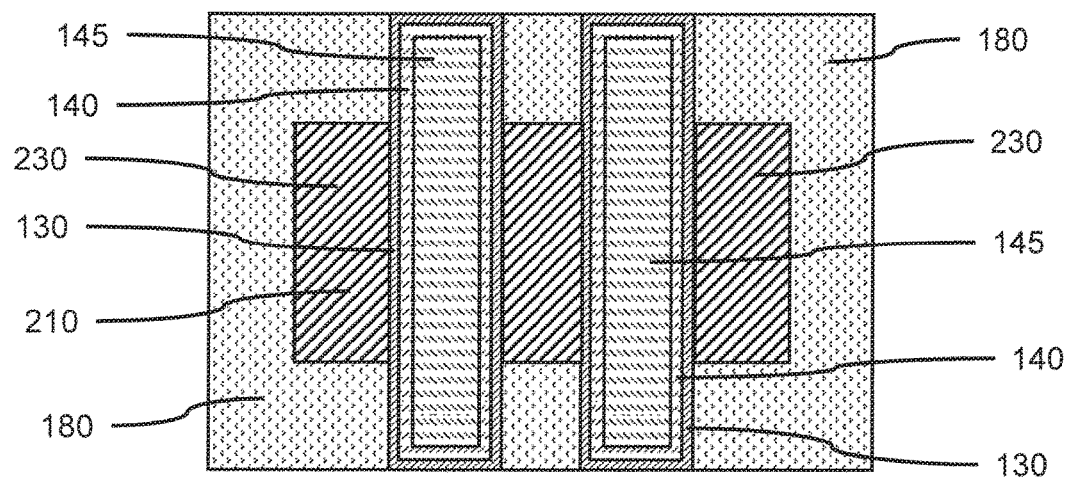
FIG. 12 is a top view showing the source/drain contact caps in the troughs adjacent to the protective layer and gate structures, in accordance with an embodiment of the present invention.

FIG. 12 is a top view showing the source/drain contact caps in the troughs adjacent to the protective layer and gate structures, in accordance with an embodiment of the present invention.

In one or more embodiments, the source/drain contact cap 230 can be in contact with the protective layer 130 and the ILD layer 180.

Figure 13:
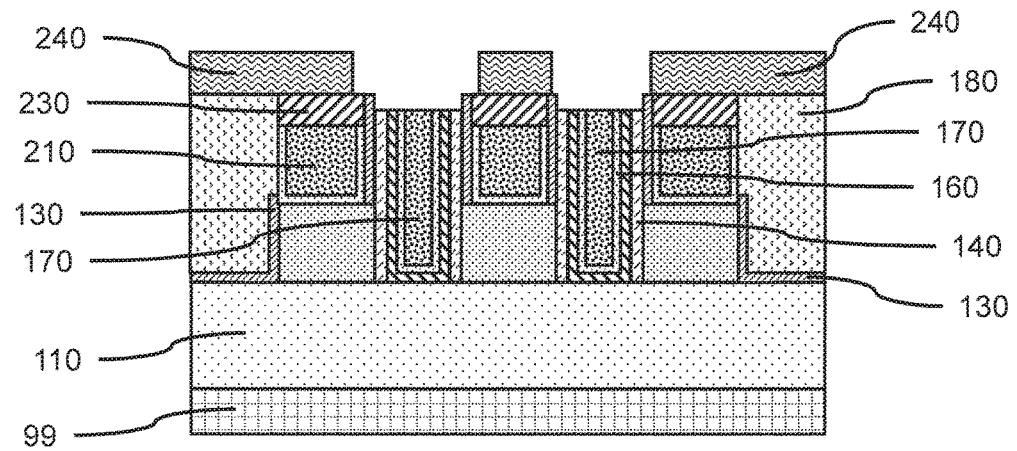
FIG. 13 is a cross-sectional side view showing a masking layer on the ILD layer and source/drain contact caps, and an exposed portion of the gate structure after removal of the gate structure caps, in accordance with an embodiment of the present invention.

FIG. 13 is a cross-sectional side view showing a masking layer on the ILD layer and source/drain contact caps, and an exposed portion of the gate structure after removal of the gate structure caps, in accordance with an embodiment of the present invention.

In one or more embodiments, a masking layer 240 can be formed on the ILD layer 180, source/drain contact caps 230, and protective layer 130, where the masking layer can be a resist material (e.g., PMMA). The masking layer 240 can be patterned and developed to expose one or more of the gate structure cap(s) 145, as would be known in the art.

In one or more embodiments, an opening may be formed in the masking layer 240 to expose a predetermined section of the gate structure cap(s) 145 on the gate structure. The predetermined section of the gate structure cap(s) 145 exposed can be in a center portion of the gate structure (e.g., approximately equal distance from either end of the gate structure) and gate structure cap, or displaced laterally towards one or the other end of the gate structure and gate structure cap. In various embodiments, each opening formed in the masking layer 240 may be arranged in a line on each adjacent gate structure cap 145, so a straight electrical contact can be formed on each gate structure.

In one or more embodiments, the exposed portion of the gate structure cap(s) 145 can be removed to expose the underlying portions of the dielectric layer 150, conductive gate fill 170, and work function layer 160 if present, where the exposed portion of the gate structure cap(s) 145 can be removed using a selective etch (e.g., RIE, selective wet etch). The dielectric layer 150, conductive gate fill 170, and work function layer 160 can be etched back to form a recess between the protective layers 130 on the sides of the gate structure(s). In various embodiments, a selective etches, (e.g., RIE) can be used to remove a top portion of the dielectric layer 150, the conductive gate fill 170, and the work function layer 160 to form the recess.

Figure 14:
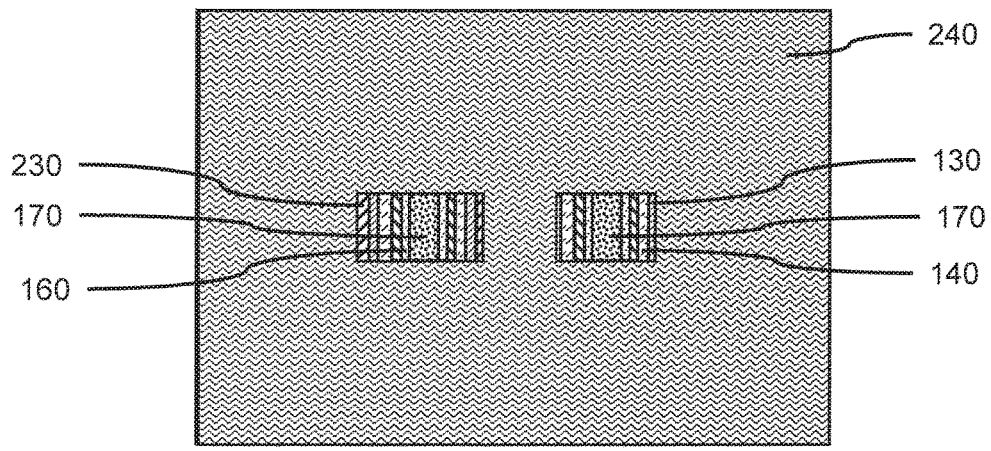
FIG. 14 is a top view showing portions of the gate structures exposed through gaps in the masking layer after removal of portions of the gate structure caps, in accordance with an embodiment of the present invention.

FIG. 14 is a top view showing portions of the gate structures exposed through gaps in the masking layer after removal of portions of the gate structure caps, in accordance with an embodiment of the present invention.

In one or more embodiments, the openings in the masking layer 240 can be located over equivalent center portions of two or more neighboring gate structure cap(s) 145, so a single subsequently formed linear electrical contact can create an electrical connection to each underlying gate structure. The central portion to the gate structure cap(s) 145 can be removed to expose the conductive gate fill 170 for forming the electrical contact. In various embodiments, the openings can be located closer to one end of the gate structure or the other end of the gate structure, or the openings can be staggered between adjacent gate structures, for example, alternating between being towards one end of a gate structure for a first gate structure and towards the opposite end of the gate structure for a second gate structure next to the first gate structure, to increase the lateral distance between subsequently formed electrical contacts.

In various embodiment, the opening(s) in masking layer 240 do not need to be directly aligned with the edges of the gate sidewall spacer 140 because the material of the gate sidewall spacer 140 and gate structure cap(s) 145 can be selectively removed relative to the protective layer 130 and source/drain contact cap 230. Since the material and thickness of the gate sidewall spacer 140 and protective layer 130 can determine the position and separation of the gate structure to the source/drain contact liner 200 and source/drain contact fill 210, the electrical contacts to the gate structure are self-aligned with the electrical contacts to the source/drains. Electrical shorts between electrical contacts can, thereby, be avoided by controlled formation of the intervening electrically insulating dielectric layers.

Figure 15:
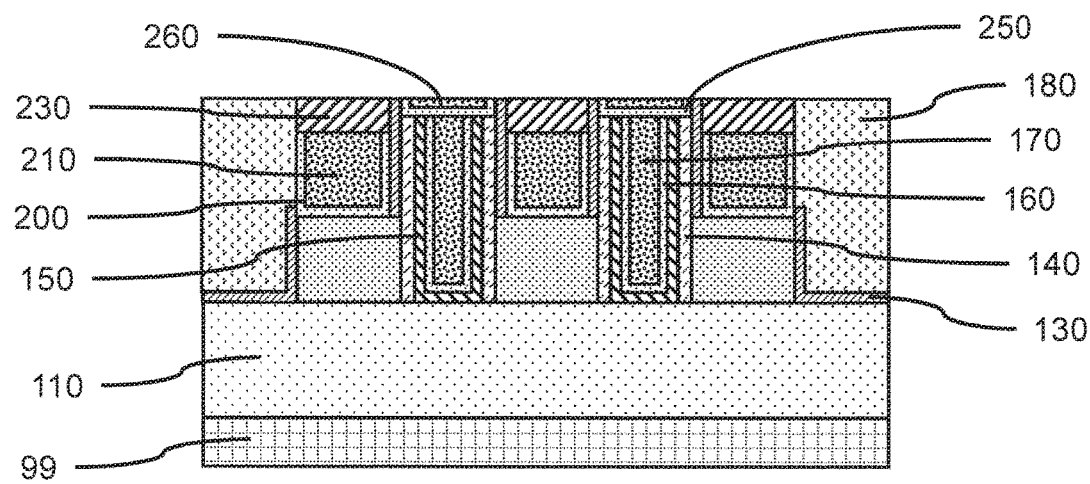
FIG. 15 is a cross-sectional side view showing a gate contact liner and a gate contact layer forming a gate contact on the gate structures, in accordance with an embodiment of the present invention.

FIG. 15 is a cross-sectional side view showing a gate contact liner and a gate contact layer forming a gate contact on the gate structures, in accordance with an embodiment of the present invention.

In one or more embodiments, a gate contact liner 250 and a gate contact layer 260 can be formed on the dielectric layer 150, conductive gate fill 170, and work function layer 160 to form a gate contact to the gate electrode. A gate contact liner 250 can be formed in the recessed portion of the gate structure. The gate contact liner 250 can be blanket deposited, conformally deposited, or a combination of conformally and blanket deposited to control the thickness of the gate contact liner 250 on the top surfaces of the gate sidewall spacer 140, dielectric layer 150, conductive gate fill 170, and work function layer 160 and sidewalls of the protective layer 130, such that a pocket remains within the gate contact liner 250 for the gate contact layer 260.

In one or more embodiments, the gate contact liner 250 can be a metal nitride, including but not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), or combinations thereof, where the gate contact liner 250 can be a liner and/or seed layer for a gate contact layer 260.

In one or more embodiments, the gate contact layer 260 can be a conductive metal, where the metal may be tungsten (W), titanium (Ti), molybdenum (Mo), cobalt (Co), or a conductive carbon material (e.g., carbon nanotube, graphene, etc.), or a suitable combinations thereof.

In one or more embodiments, the gate contact liner 250 can be formed to provide an ohmic contact between the gate electrode and the gate contact layer 260.

In one or more embodiments, the masking layer 240 can be removed before the gate contact liner 250 and/or gate contact layer 260 are formed, and a CMP used to removed excess material and provide a smooth, flat surface, or the masking layer can be removed after formation of gate contact liner 250 and/or gate contact layer 260 as a lift-off process. The masking layer 240 can be removed using techniques known in the art (e.g., stripping, ashing, etc.).

Figure 16:
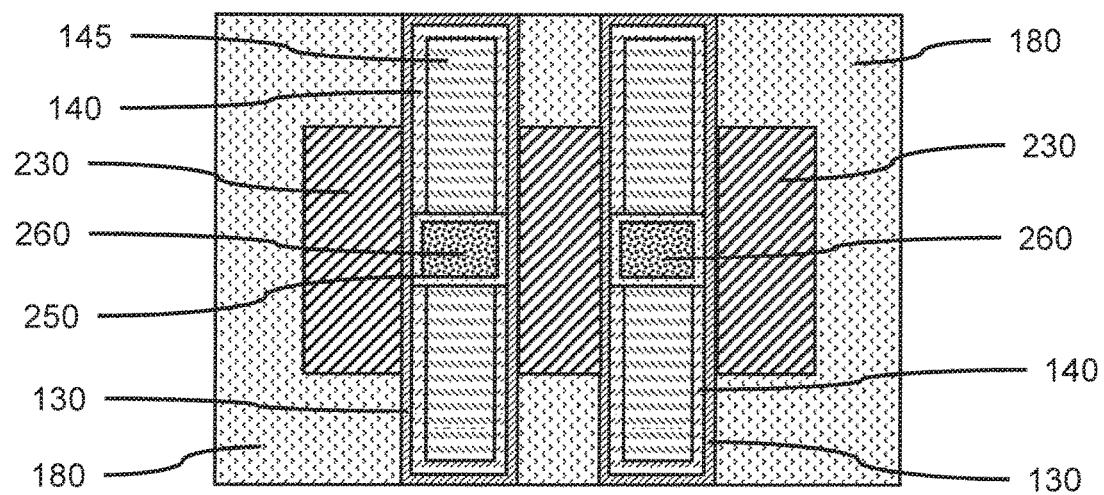
FIG. 16 is a top view showing the gate contacts, including the gate contact liner and a gate contact layer, formed through a portion of each gate structure cap, in accordance with an embodiment of the present invention.

FIG. 16 is a top view showing the gate contacts, including the gate contact liner and a gate contact layer, formed through a portion of each gate structure cap, in accordance with an embodiment of the present invention.

In one or more embodiments, the gate contact liner 250 of the gate contacts can be separated from the source/drain contact cap 230 by the protective layer 130. The gate contact(s) can be adjacent to the source/drain contact cap 230.

Figure 17:
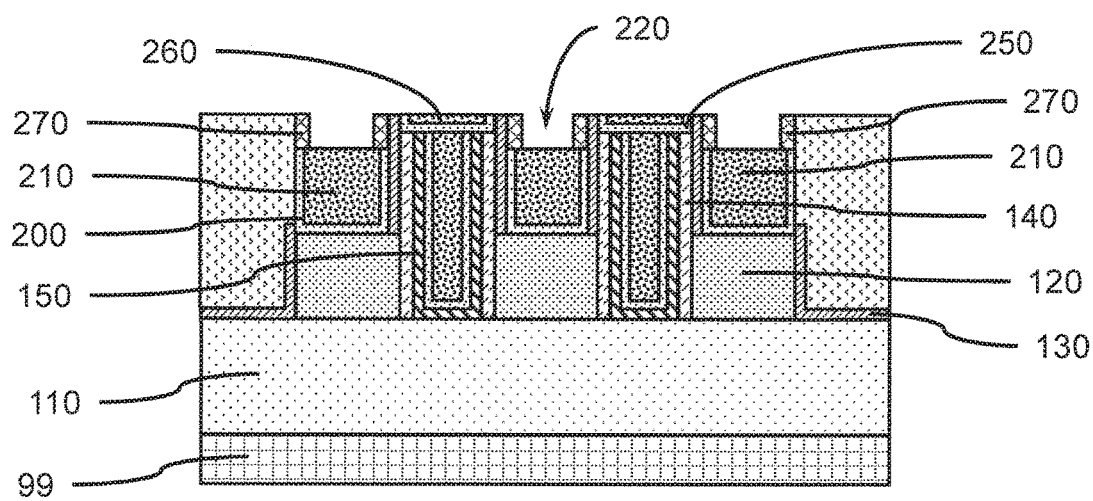
FIG. 17 is a cross-sectional side view showing an inner spacer formed in each trough after removal of the source/drain contact caps, in accordance with an embodiment of the present invention.

FIG. 17 is a cross-sectional side view showing an inner spacer formed in each trough after removal of the source/drain contact caps, in accordance with an embodiment of the present invention.

In one or more embodiments, the source/drain contact cap(s) 230 can be removed to reopen the trough(s) 220, where the source/drain contact cap(s) 230 can be removed using an etch that is selective relative to the gate contact liner 250, gate contact layer 260, gate structure cap(s) 145, and ILD layer 180. Removal of the source/drain contact cap(s) 230 can expose the underlying source/drain contact fill 210.

In one or more embodiments, an inner spacer 270 can be formed in the trough 220, where the inner spacer 270 can be formed by a conformal deposition (e.g., ALD, PEALD) on the sidewalls of the ILD layer 180 and protective layer 130 exposed by removal of the source/drain contact cap 230. A directional etch (e.g., RIE) can be used to remove inner spacer material deposited on the source/drain contact fill 210 to leave the inner spacer 270 around the periphery of the trough 220 and on source/drain contact liner 200.

In one or more embodiments, the inner spacer 270 can be a silicon nitride (SiN), silicon oxynitride (SiON), a low-k dielectric, a high-k dielectric, silicon borocarbonitride (SiBCN), silicon oxycarbide (SiOC), silicon boro oxycarbide (SIBOC), or combinations thereof, although other insulating dielectrics are also contemplated. In various embodiments, the inner spacer 270, gate structure cap(s) 145, and gate sidewall spacer 140 can be the same material or different materials.

Figure 18:
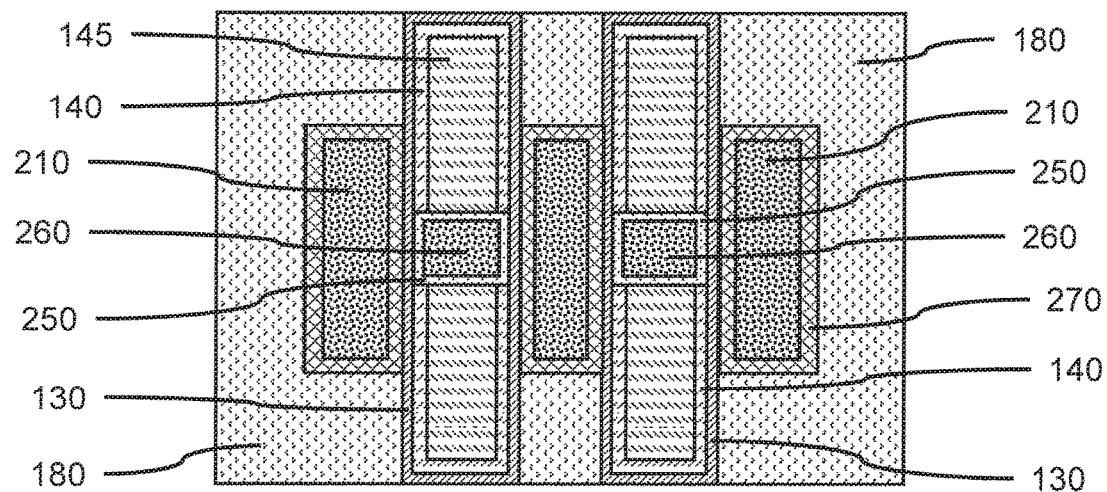
FIG. 18 is a top view showing the inner spacer and top surface of the gate contact layer in the troughs, and the gate contacts in the gate structure caps, in accordance with an embodiment of the present invention.

FIG. 18 is a top view showing the inner spacer and top surface of the gate contact layer in the troughs, and the gate contacts in the gate structure caps, in accordance with an embodiment of the present invention.

In one or more embodiments, the inner spacer 270 can have a thickness in the range of about 1 nm to about 4 nm, or in the range of about 2 nm to about 3 nm, although other thicknesses are contemplated.

In one or more embodiments, the inner spacer 270 and area of the source/drain contact fill 210 can be larger than the gate contact liner 250 and gate contact layer 260 forming the gate contact.

Figure 19:
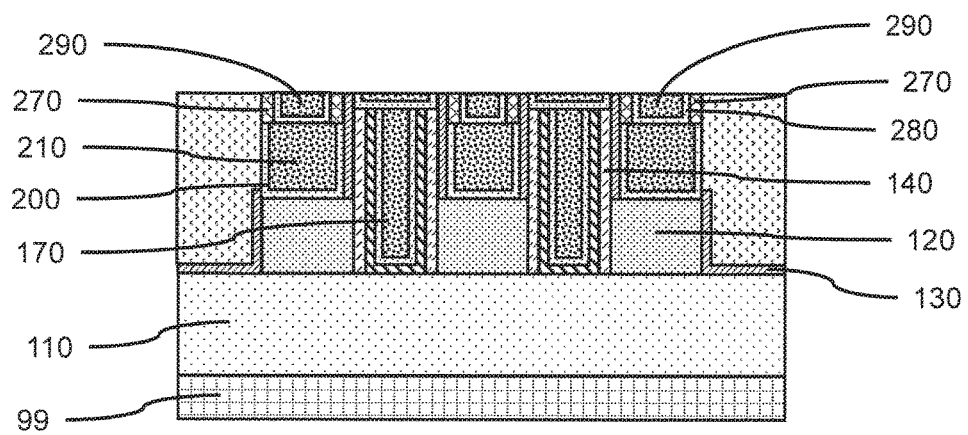
FIG. 19 is a cross-sectional side view showing a source/drain contact terminal layer and source/drain terminal fill in the troughs within the inner spacer, in accordance with an embodiment of the present invention.

FIG. 19 is a cross-sectional side view showing a source/drain contact terminal layer and source/drain terminal fill in the troughs within the inner spacer, in accordance with an embodiment of the present invention.

In one or more embodiments, a source/drain contact terminal layer 280 can be formed on the inner spacer 270 and source/drain contact fill 210, where the source/drain contact terminal layer 280 can be conformally deposited (e.g., ALD), such that a pocket remains within the source/drain contact terminal layer 280 for a source/drain terminal fill 290. The source/drain terminal fill 290 can be formed on the source/drain contact terminal layer 280, where the source/drain terminal fill 290 can be conformally or blanket deposited. The source/drain contact terminal layer 280 and source/drain terminal fill 290 can form a source/drain contact.

In one or more embodiments, the source/drain contact terminal layer 280 can be a metal nitride, including but not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), or combinations thereof, where the gate contact liner 250 can be a liner and/or seed layer for a source/drain terminal fill 290.

In one or more embodiments, the source/drain terminal fill 290 can be a conductive metal, where the metal may be tungsten (W), titanium (Ti), molybdenum (Mo), cobalt (Co), or a conductive carbon material (e.g., carbon nanotube, graphene, etc.), or a suitable combinations thereof.

The inner spacer 270 can electrically isolate the source/drain contact terminal layer 280 and source/drain terminal fill 290 from the gate contact.

Figure 20:
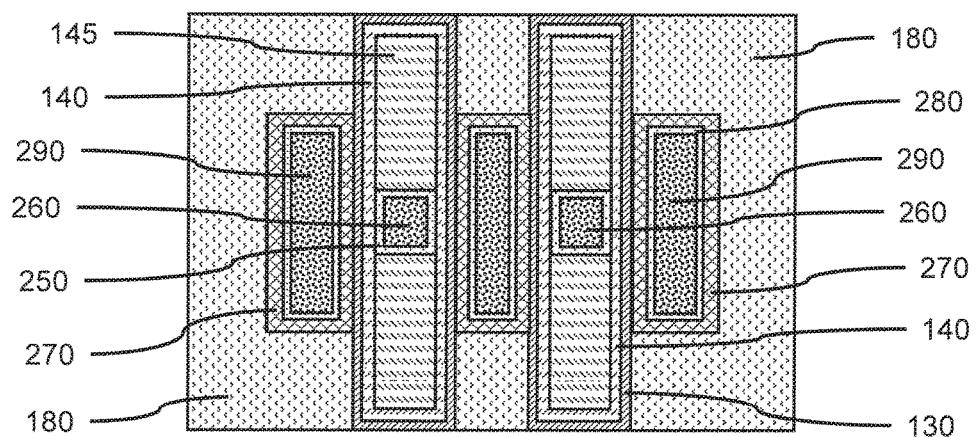
FIG. 20 is a top view showing the source/drain terminal fill within the source/drain contact terminal layer and inner spacer in the troughs, in accordance with an embodiment of the present invention.

FIG. 20 is a top view showing the source/drain terminal fill within the source/drain contact terminal layer and inner spacer in the troughs, in accordance with an embodiment of the present invention.

In one or more embodiments, the gate contacts can be between the source/drain contacts, where the inner spacer 270 and protective layer 130 electrically isolate the self-aligned electrical contacts from each other.

Figure 21:
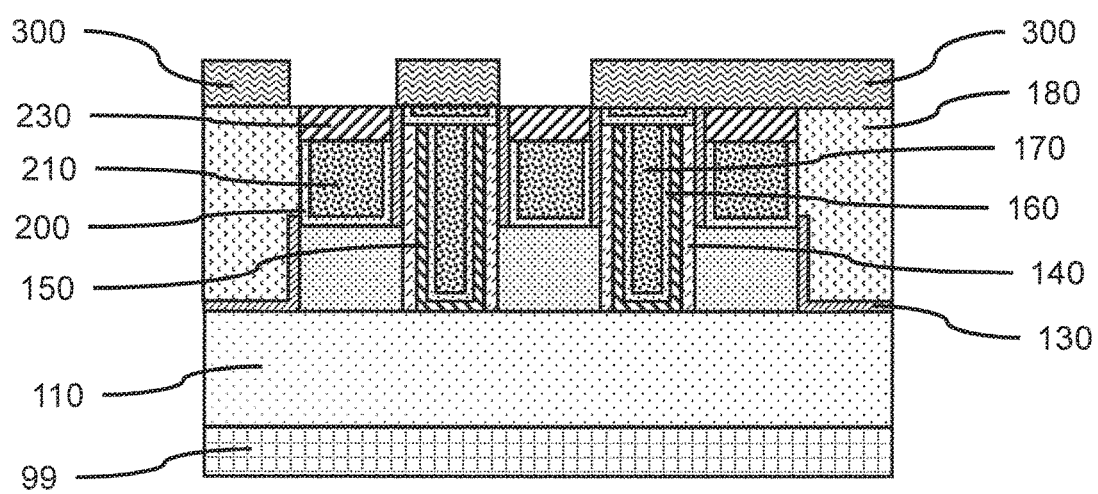
FIG. 21 is a cross-sectional side view showing another embodiment of a masking layer on the ILD layer that exposes portions of the source/drain contact caps offset from the gate contacts on the gate structures, in accordance with another embodiment of the present invention.

FIG. 21 is a cross-sectional side view showing another embodiment of a masking layer on the ILD layer that exposes portions of the source/drain contact caps offset from the gate contacts on the gate structures, in accordance with another embodiment of the present invention.

In another embodiment, the source/drain contact cap(s) 230 as shown in FIGS. 15 and 16, can be covered by masking layer 300, which can be patterned and developed to expose particular portions of source/drain contact cap(s) 230, rather than leaving the entire source/drain contact cap 230 exposed to reform the troughs 220 as depicted in FIG. 17. The exposed portions can be in line, or staggered to increase the separation distance.

Figure 22:
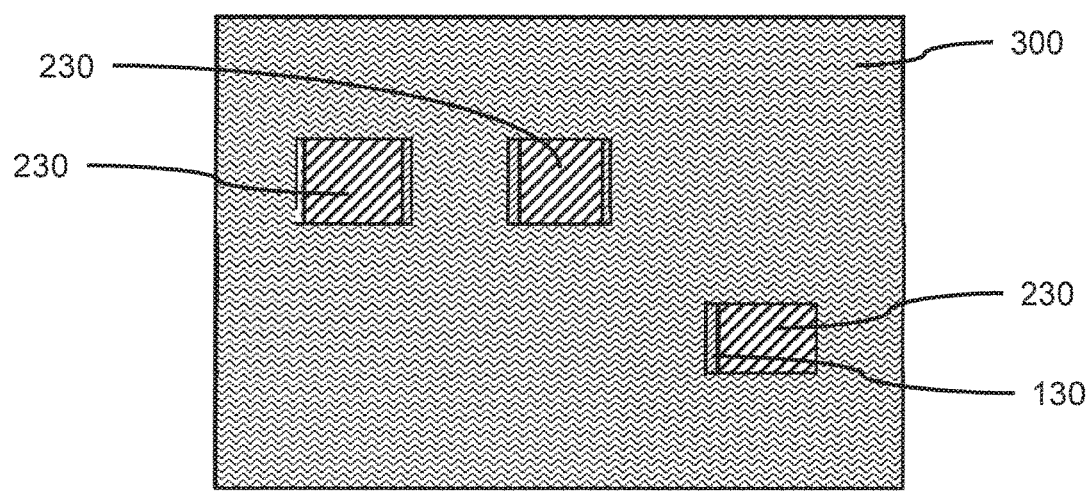
FIG. 22 is a top view showing the exposes portions of the source/drain contact caps offset from the center section of the gate structures and the gate contacts, in accordance with another embodiment of the present invention.

FIG. 22 is a top view showing the exposes portions of the source/drain contact caps offset from the center section of the gate structures and the gate contacts, in accordance with another embodiment of the present invention.

In one or more embodiments, the openings formed in masking layer 300 can expose predetermined portions of the source/drain contact cap(s) 230, where the openings can be staggered, so the openings are not in line with the gate contact(s) and/or each other. A portion of the source/drain contact cap 230 can remain covered by the masking layer 300. The exposed portion can be closer to one end of the source/drain contact fill.

Figure 23:
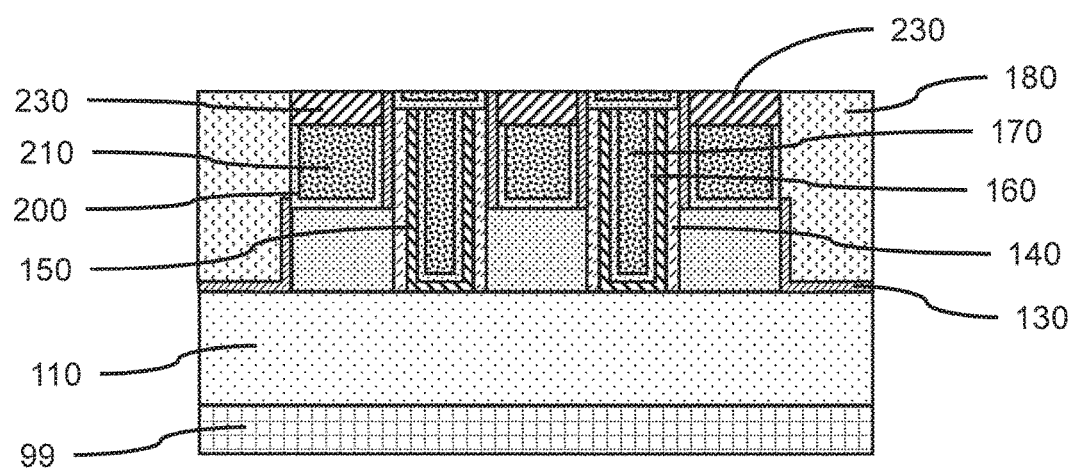
FIG. 23 is a cross-sectional side view showing the source/drain contact caps in the troughs, in accordance with an embodiment of the present invention.

FIG. 23 is a cross-sectional side view showing the source/drain contact caps in the troughs, in accordance with an embodiment of the present invention.

Figure 24:
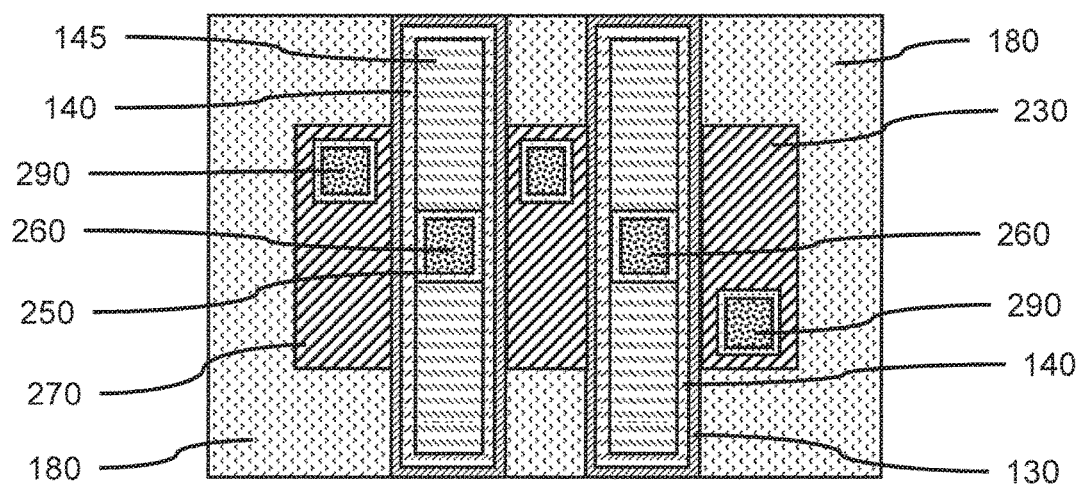
FIG. 24 is a top view showing the source/drain terminals offset from the center section of the gate structures and the gate contacts, in accordance with another embodiment of the present invention.

A cross-section of the substrate 99 and device components along the same cut line through the center of the gate structures illustrate that the source/drain contact cap(s) 230 remain on the center portion of the source/drain contact fill 210, whereas FIG. 24 shows the off-center positioning of the source/drain contacts.

FIG. 24 is a top view showing the source/drain terminals offset from the center section of the gate structures and the gate contacts, in accordance with another embodiment of the present invention.

In one or more embodiments, the source/drain contacts and the gate contacts can be staggered, so the source/drain contacts and the gate contacts are not in line. The source/drain contacts and the gate contacts can be off-set from each other in two dimensions, so the electrical contacts are diagonally displaced from each other to increase the distance and thickness of the intervening dielectric material. The source/drain contacts and the gate contacts can be arranged in a two-dimensional grid layout, where the two-dimensional lateral off-set can improve reliability of the devices (e.g., nFETs, pFET, FinFETs, etc.).

In the various embodiments, the source/drain contacts and the gate contacts are directly above the source/drains and gate electrodes, respectively, to reduce the device footprint on the substrate 99.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an active device having self-aligned source/drain contacts and gate contacts, comprising:
   forming an active area on a substrate, where the active area includes a device channel;
   forming two or more gate structures on the active area;
   forming a plurality of source/drains on the top surface of the active area adjacent to the two or more gate structures and device channel, wherein at least one of the plurality of source/drains is between a pair of the two or more gate structures;
   forming a protective layer on the sidewall surfaces of each of the two or more gate structures, on the sidewall surfaces of at least two of the plurality of source/drains, and on the active layer, wherein the protective layer has a thickness in the range of about 4 nm to about 15 nm;
   forming an interlayer dielectric layer on the protective layer;
   removing a portion of the interlayer dielectric and protective layer to form a plurality of openings, where each opening exposes at least a portion of one of the plurality of source/drains and a potion of the protective layer on one side of the opening, but not on an opposite side of the opening;
   forming a source/drain contact liner in at least one of the plurality of openings, wherein the protective layer is between the source/drain contact liner and at least one of the two or more gate structures; and
   forming a source/drain contact fill on the source/drain contact liner.

2. The method of claim 1, further comprising removing a portion of the source/drain contact liner and source/drain contact fill formed in each opening to form a trough, and forming a source/drain contact cap in each trough.

3. The method of claim 2, wherein each of the two or more gate structures includes a gate dielectric layer, a conductive gate fill, and a work function layer within a gate sidewall spacer, where the gate dielectric layer, conductive gate fill, and work function layer are covered by a gate structure cap.

4. The method of claim 3, the source/drain contact cap and gate structure cap are silicon nitride (SiN), silicon oxynitride (SiON), a low-k dielectric, a high-k dielectric, silicon borocarbonitride (SiBCN), silicon oxycarbide (SiOC), silicon boro oxycarbide (SIBOC), or combinations thereof, and the source/drain contact cap is a different material from the gate structure cap.

5. The method of claim 4, wherein the source/drain contact liner is a metal nitride.

6. The method of claim 3, further comprising removing at least a portion of the gate structure cap to expose a portion of the gate structure, and forming a gate contact liner and gate contact layer on at least a portion of the conductive gate fill.

7. The method of claim 6, further comprising removing the source/drain contact cap to reopen the trough, and forming an inner spacer in the trough.

8. The method of claim 6, wherein the inner spacer is formed by a conformal deposition.

9. The method of claim 8, wherein the inner spacer is a silicon nitride (SiN), silicon oxynitride (SiON), a low-k dielectric, a high-k dielectric, silicon borocarbonitride (SiBCN), silicon oxycarbide (SiOC), silicon boro oxycarbide (SIBOC), or combinations thereof.

10. A method of forming an active device having self-aligned source/drain contacts and gate contacts, comprising:
    forming an active area on a substrate, where the active area includes a device channel;
    forming two or more gate structures on the same active area, wherein each of the two or more gate structures includes a gate dielectric layer, a conductive gate fill, and a work function layer within a gate sidewall spacer, and the gate dielectric layer, conductive gate fill, and work function layer are covered by a gate structure cap;
    forming a plurality of source/drains on the active area adjacent to the two or more gate structures and device channel, wherein at least one of the plurality of source/drains is between a pair of the two or more gate structures;
    forming a protective layer on the sidewall surfaces of each of the two or more gate structures, on the sidewall surfaces of at least two of the plurality of source/drains, and on the active layer, wherein the protective layer has a thickness in the range of about 4 nm to about 15 nm;
    forming an interlayer dielectric layer on the protective layer;
    removing a portion of the interlayer dielectric and protective layer to form a plurality of openings, where each opening exposes at least a portion of one of the plurality of source/drains and a potion of the protective layer on one side of the opening, but not on an opposite side of the opening;

forming a source/drain contact liner in at least one of the plurality of openings, wherein the protective layer is between the source/drain contact liner and the gate sidewall spacer on one of the two or more gate structures; and forming a source/drain contact fill on the source/drain contact liner.

11. The method of claim 10, wherein the gate sidewall spacer has a thickness in the range of about 4 nm to about 15 nm.

12. The method of claim 10, further comprising removing at least a portion of the gate structure cap to expose a portion of the gate structure, and forming a gate contact liner and gate contact layer on at least a portion of the conductive gate fill.

13. The method of claim 12, wherein the gate contact layer is tungsten (W), titanium (Ti), molybdenum (Mo), cobalt (Co), a conductive carbon material, or a suitable combinations thereof.

* * * * *